United States Patent
Moon et al.

(10) Patent No.: US 9,490,275 B2
(45) Date of Patent: Nov. 8, 2016

(54) METHOD FOR MANUFACTURING THIN FILM TRANSISTOR ARRAY PANEL

(71) Applicant: Samsung Display Co., Ltd., Yongin, Gyeonggi-Do (KR)

(72) Inventors: Young Min Moon, Seongnam-si (KR); Jong-Hyun Choung, Hwaseong-si (KR); Bong-Kyun Kim, Hwaseong-si (KR)

(73) Assignee: SAMSUNG DISPLAY CO., LTD. (KR)

(*) Notice: Subject to any disclaimer, the term of this patent is extended or adjusted under 35 U.S.C. 154(b) by 0 days.

(21) Appl. No.: 14/740,484

(22) Filed: Jun. 16, 2015

(65) Prior Publication Data

US 2016/0218114 A1    Jul. 28, 2016

(30) Foreign Application Priority Data

Jan. 22, 2015 (KR) .................. 10-2015-0010711

(51) Int. Cl.

| | |
|---|---|
| *H01L 27/00* | (2006.01) |
| *H01L 29/00* | (2006.01) |
| *H01L 27/12* | (2006.01) |
| *H01L 29/51* | (2006.01) |
| *H01L 29/49* | (2006.01) |

(Continued)

(52) U.S. Cl.
CPC ......... *H01L 27/124* (2013.01); *H01L 27/1222* (2013.01); *H01L 27/1259* (2013.01); *H01L 29/42356* (2013.01); *H01L 29/495* (2013.01); *H01L 29/4908* (2013.01); *H01L 29/4966* (2013.01); *H01L 29/513* (2013.01); *H01L 29/7843* (2013.01)

(58) Field of Classification Search
CPC ............. H01L 27/124; H01L 27/1259; H01L 27/1222; H01L 29/4966; H01L 29/4908; H01L 29/7843; H01L 29/495; H01L 29/42356; H01L 29/513
See application file for complete search history.

(56) References Cited

U.S. PATENT DOCUMENTS

| | | | | | |
|---|---|---|---|---|---|
| 6,097,038 | A | * | 8/2000 | Jinno | .................. H01L 21/2026 257/57 |
| 6,355,943 | B1 | * | 3/2002 | Sung | .................. H01L 29/4908 257/324 |
| 6,645,826 | B2 | * | 11/2003 | Yamazaki | ............... H01L 27/12 257/E21.413 |

(Continued)

FOREIGN PATENT DOCUMENTS

| | | |
|---|---|---|
| KR | 1020010063866 A | 7/2001 |
| KR | 1020070109483 A | 11/2007 |

(Continued)

*Primary Examiner* — Nikolay Yushin
(74) *Attorney, Agent, or Firm* — Cantor Colburn LLP

(57) ABSTRACT

A thin film transistor array panel includes: a gate line on a substrate and including a gate electrode; a first gate insulating layer on the substrate and the gate line, the first gate insulting layer including a first portion adjacent to the gate line and a second portion overlapping the gate line and having a smaller thickness than that of the first portion; a second gate insulating layer on the first gate insulating layer; a semiconductor layer on the second gate insulating layer; a source electrode and a drain electrode spaced apart from each other on the semiconductor layer; a passivation layer on the second gate insulating layer, the source electrode and the drain electrode; and a pixel electrode on the passivation layer and connected with the drain electrode. The first gate insulating layer and the second gate insulating layer have stress in opposite directions from each other.

5 Claims, 5 Drawing Sheets

(51) Int. Cl.
*H01L 29/78* (2006.01)
*H01L 29/423* (2006.01)

(56) References Cited

U.S. PATENT DOCUMENTS 8,269,908 B2* 9/2012 Oda .................... H01L 29/4908
  349/43
8,710,497 B2* 4/2014 Kim .................... H01L 29/7869
  257/43
2009/0159884 A1* 6/2009 Oda .................... H01L 29/66765
  257/57
2012/0104403 A1* 5/2012 Kohno ................ H01L 21/0217
  257/66
2013/0146862 A1* 6/2013 Kim .................... H01L 27/1225
  257/43

FOREIGN PATENT DOCUMENTS

KR  1020130017597 A  2/2013
KR  1020130028274 A  3/2013

* cited by examiner

METHOD FOR MANUFACTURING THIN FILM TRANSISTOR ARRAY PANEL This application claims priority to Korean Patent Application No. 10-2015-0010711 filed on Jan. 22, 2015, the entire contents of which are incorporated herein by reference.

BACKGROUND (a) Field

The invention relates to a thin film transistor array panel and a method for manufacturing the same.

(b) Description of the Related Art

Generally, a thin film transistor ("TFT") is used as a switching element for independently driving a pixel within a flat panel display such as a liquid crystal display and an organic light emitting display. The flat panel display includes a display panel such as a thin film transistor array panel. The thin film transistor array panel includes the thin film transistor, a pixel electrode connected to the thin film transistor, a gate line transferring a gate signal to the thin film transistor, a data line transferring a data signal to the thin film transistor, and the like.

The thin film transistor includes a gate electrode connected with the gate line and receiving the gate signal, a semiconductor layer on the gate electrode, a source electrode on the semiconductor layer and connected with the data line to receive the data signal, and a drain electrode spaced apart from the source electrode and connected with the pixel electrode. The gate line, the gate electrode, the data line, the source electrode, the drain electrode, and the like are configured as metal wires.

SUMMARY

In order to process an image signal at a relatively high speed, a low-resistive copper wire may be used as a metal wire in a display panel of a flat panel display such as for a gate line, a gate electrode, a data line, a source electrode, a drain electrode, and the like. In order to implement a relatively high-resolution display device, a thickness of the metal wire may be relatively large. When the thickness of the copper wire is relatively large, a defect in the metal wire such as a crack may be generated due to a step difference defined by thicknesses of the copper wire and an insulating layer disposed thereon. Therefore, there remains a need for reducing disconnection of a low-resistive wire and an insulating layer thereon.

One or more exemplary embodiment of the invention provides a thin film transistor array panel and a method for manufacturing the same having advantages in that disconnection of an insulating layer disposed on a low-resistive wire is reduced or effectively prevented.

An exemplary embodiment of the invention provides a thin film transistor array panel including: a gate line on a substrate and including a gate electrode; a first gate insulating layer on the substrate and the gate line, the first gate insulating layer including a first portion on the substrate and adjacent to the gate line and a second portion overlapping the gate line, the second portion having a thickness smaller than that of the first portion; a second gate insulating layer on the first gate insulating layer; a semiconductor layer on the second gate insulating layer; a source electrode and a drain electrode spaced apart from each other on the semiconductor layer; a passivation layer on the second gate insulating layer, the source electrode and the drain electrode; and a pixel electrode on the passivation layer and connected with the drain electrode. The first gate insulating layer and the second gate insulating layer have stress in opposite directions from each other.

The gate electrode may include copper or a copper alloy.

The first gate insulating layer may have tensile stress, and the second gate insulating layer may have compressive stress.

The tensile stress of the first gate insulating layer may be about 270 megapascals (MPa) to about 404 MPa, and the compressive stress of the second gate insulating layer may be about 343 MPa to about 515 MPa.

The thickness of the first portion may be the same as that of the gate line.

The first gate insulating layer and the second gate insulating layer may include a same material.

Another exemplary embodiment of the invention provides a method for a thin film transistor array panel, the method including: forming a gate line including a gate electrode on a substrate; forming an insulating material layer on the substrate and the gate line; forming a first gate insulating layer from the insulating material layer, by forming a first portion thereof, and forming a second portion thereof by removing a portion of the insulating material layer overlapping the gate line; forming a second gate insulating layer having stress in an opposite direction to that of the first gate insulating layer on the first gate insulating layer; forming a semiconductor layer on the second gate insulating layer; forming a source electrode and a drain electrode spaced apart from each other on the semiconductor layer; forming a passivation layer on the second gate insulating layer, the source electrode and the drain electrode; and forming a pixel electrode connected with the drain electrode on the passivation layer. A thickness of the second portion is smaller than that of the first portion by the removing the portion of the insulating material layer overlapping the gate line.

According to one or more exemplary embodiment of the invention, the first gate insulating layer including the first portion and the smaller thickness second portion are disposed on the substrate and the gate line, thereby minimizing a step of the first gate insulating layer due to the relatively large thickness of the gate line. As a result, a defect in the first gate insulating layer such as a crack generated by the step due to the relatively large thickness of the gate line may be reduced or effectively prevented. Further, a defect in the data line and the drain electrode which are disposed on the gate line due to the step of the first gate insulating layer formed by the relatively large thickness of the gate line may also be reduced or effectively prevented.

Further, the second gate insulating layer having compressive stress which is stress in an opposite direction to that of the first gate insulating layer is disposed on the first gate insulating layer, thereby reducing or effectively preventing a defect on the surface of the first gate insulating layer such as a crack due to a hillock.

Further, in a method of manufacturing the thin film transistor array panel, since the second gate insulating layer has chemical resistance to the etchant used in a subsequent process, erosion of the surface of the second gate insulating layer by the etchant may be reduced or effectively prevented.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
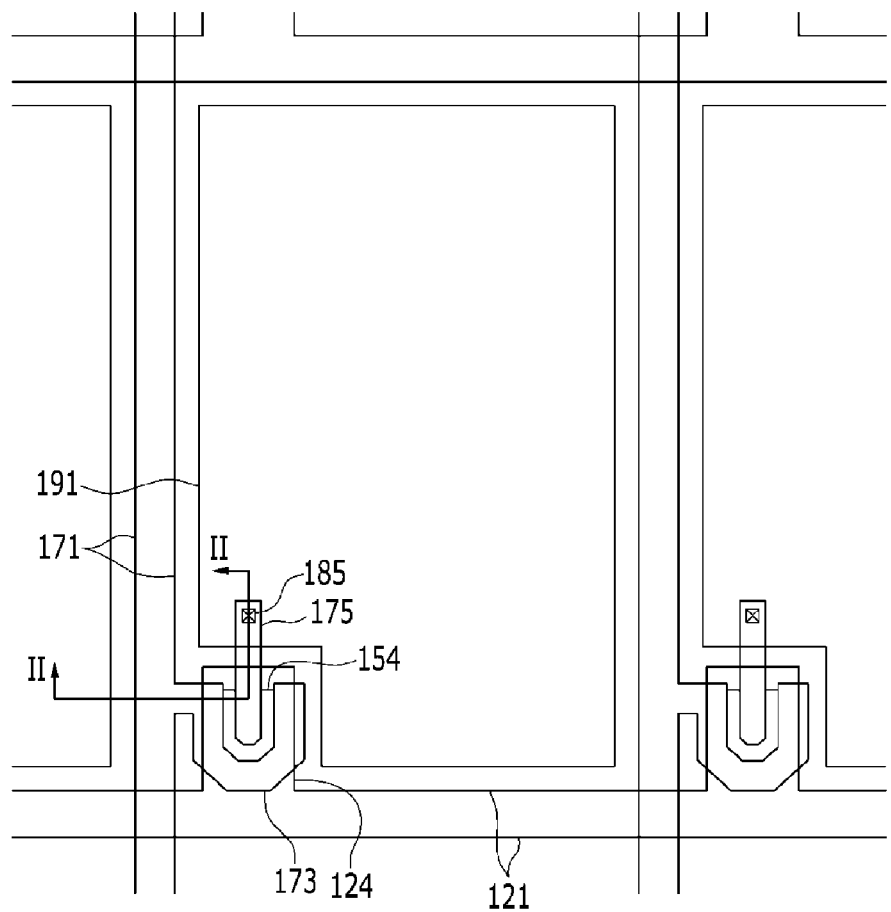
FIG. 1 is a plan view of an exemplary embodiment of a thin film transistor array panel according to the invention.

The invention will be described more fully hereinafter with reference to the accompanying drawings, in which exemplary embodiments of the invention are illustrated. As those skilled in the art would realize, the described exemplary embodiments may be modified in various different ways, all without departing from the spirit or scope of the invention.

Accordingly, the drawings and description are to be regarded as illustrative in nature and not restrictive. Like reference numerals designate like elements throughout the specification.

In addition, the size and thickness of each configuration illustrated in the drawings are arbitrarily illustrated for understanding and ease of description, but the invention is not limited thereto.

In the drawings, the thicknesses of layers, films, panels, regions, and the like, are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements. Further, throughout the specification, the word "on" means positioning on or below the object portion, but does not essentially mean positioning on the upper side of the object portion based on a gravity direction.

Further, throughout the specification, the word "on a plane" means viewing a target portion from the top, and the word "on a cross section" means viewing a cross section formed by vertically cutting a target portion from the side.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
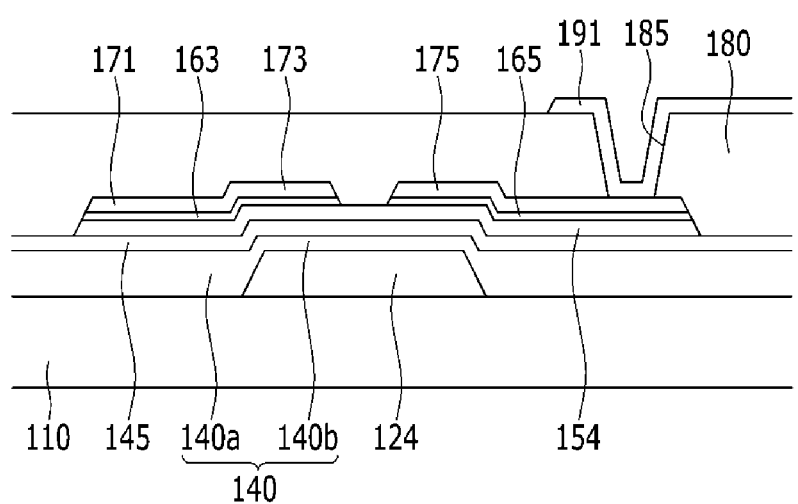
FIG. 2 is a cross-sectional view of the thin film transistor array panel of FIG. 1 taken along line II-II.

FIG. 1 is a top plan view of an exemplary embodiment of a thin film transistor array display panel according to the invention. FIG. 2 is a cross-sectional view of the thin film transistor array display panel of FIG. 1 taken along line II-II.

Referring to FIGS. 1 and 2, the thin film transistor array display panel includes a substrate 110 and a plurality of thin film structures such as a plurality of gate lines 121, a semiconductor layers, a plurality of data lines 171, a plurality of drain electrodes 175, and a plurality of pixel electrodes 191, which are disposed on the substrate 110.

Among the plurality of thin film structures described in more detail hereinafter, the plurality of gate lines 121 is disposed on the substrate 110. The substrate may include an insulating material such as glass or plastic.

The gate lines 121 transfer a gate signal and are elongated to mainly extend in a horizontal direction in the plan view. Each gate line 121 includes a plurality of gate electrodes 124 protruding from a main portion thereof such as in a direction vertically upwards in the plan view. The gate line 121 may include or be formed from a relatively low electrical resistive metal material such as copper (Cu) or a copper alloy. Among metal signal wires within the thin film transistor array display panel, a cross-sectional thickness of the gate line 121 including the low electrical resistive metal material may be about 1 micrometer (μm) or more to reduce electrical resistance thereof.

A first gate insulating layer 140 is disposed on the substrate 110 and the gate line 121. The first gate insulating layer 140 may include or be formed from an inorganic insulating material such as silicon nitride (SiNx) and silicon oxide (SiOx). Here, the first gate insulating layer 140 has or is formed to have a tensile stress of about 270 megapascals (MPa) to about 404 MPa. A tensile stress of the above-described range reduces or effectively prevents the substrate 110 from being bent or deformed such as by a compressive stress applied thereto from the relatively thick gate line 121 disposed on the substrate 110.

The first gate insulating layer 140 includes a first portion 140a having a cross-sectional thickness and a second portion 140b having a cross-sectional thickness smaller than that of the first portion 140a. The cross-sectional thickness of the first portion 140a may be substantially the same as that of the gate line 121 and is disposed on the substrate 110 adjacent to a side surface of the gate line 121. A maximum distance of an upper surface of the first portion 140a and the gate line 121 taken from a common reference such as an upper surface of the substrate, may be substantially the same.

The second portion 140b of the first gate insulating layer 140 is disposed on and overlapping the gate line 121. That is, since the first portion 140a having substantially the same thickness as the gate line 121 is disposed on the substrate 110 (e.g., substantially not overlapping the gate line 121) and the second portion 140b having the smaller thickness is disposed on (e.g., overlapping) the gate line 121, a step of the first gate insulating layer 140 due to a thickness of the gate line 121 may be minimized. Accordingly, a defect within the first gate insulating layer 140 such as a crack generated due to the step thereof defined according to the thickness of the gate line 121 may be reduced or effectively prevented.

On the first gate insulating layer 140, a second gate insulating layer 145 is disposed. The second gate insulating layer 145 may include or be formed from an inorganic insulating material such as silicon nitride (SiNx) and silicon oxide (SiOx). Further, the first gate insulating layer 140 and the second gate insulating layer 145 may include and be formed from a same material and/or a same layer of material.

Here, the second gate insulating layer 145 has or is formed to have a compressive stress of about 343 MPa to about 515 MPa. That is, the first gate insulating layer 140 and the second gate insulating layer 145 have or are formed to have stresses directed in opposite directions from each other.

In the first gate insulating layer 140, a crack on the surface thereof may be generated by tensile stress applied to the first gate insulating layer 140 due to a defect such as hillock. In one or more exemplary embodiment of the invention, with the second gate insulating layer 145 disposed on the first gate insulating layer 140 and having compressive stress, the defect generated on the surface of the first gate insulating layer 140 may be reduced or effectively prevented.

Relating to an exemplary embodiment of manufacturing a flat panel display, the second gate insulating layer 145 has chemical resistance to the etchant used in an etching process for forming the data line 171 and the drain electrode 175 to be described below. The etchant used in the etching process generally causes a defect such as erosion of the surface of the underlying gate insulating layer. However, since the second gate insulating layer 145 in one or more exemplary embodiment according to the invention has the chemical resistance to the etchant, erosion of the surface of the second gate insulating layer 145 among layers of a collective gate insulating layer by the etchant may be reduced or effectively prevented.

A plurality of semiconductor layers 154 is disposed on the second gate insulating layer 145. The semiconductor layers 154 may include or be formed from an amorphous silicon semiconductor, a polysilicon semiconductor, an oxide semiconductor, or the like. When the semiconductor layers 154 include or are formed from an oxide semiconductor material, a material such as indium gallium zinc oxide ("IGZO"), zinc tin oxide ("ZTO") and indium tin oxide ("ITO") may be used. Here, a semiconductor layer 154 overlaps with the gate electrode 124.

A plurality of ohmic contacts 163 and 165 is disposed on the semiconductor layer 154 overlapping the gate electrode 124. The ohmic contacts 163 and 165 may include or be formed from a material such as n+hydrogenated amorphous silicon in which an n-type impurity such as phosphorus is doped at a high concentration, or silicide. Where the semiconductor layer 154 includes or is formed from the oxide semiconductor material, the ohmic contacts 163 and 165 may be omitted.

A plurality of data lines 171 and a plurality of drain electrodes 175 are disposed on the ohmic contacts 163 and 165. The data lines 171 transfer a data signal and are elongated to mainly extend in a vertical direction of the plan view to cross the gate line 121. Each data line 171 includes a plurality of source electrodes 173 protruded from a main portion thereof and extending horizontally toward the gate electrode 124. The drain electrode 175 is separated from the data line 171 and faces the source electrode 173 with respect to the gate electrode 124. The source electrode 173 and the drain electrode 175 overlap with the gate electrode 124 and are spaced apart from each other to expose a portion of the underlying semiconductor layer 154. Among metal signal wires within the thin film transistor array display panel, the data line 171 and the drain electrode 175 may include or be formed from a low electrical resistive metal material.

The first gate insulating layer 140 including the first portion 140a and the second portion 140b having different thicknesses from each other is disposed on the substrate 110 and the gate line 121 to thereby minimize the step thereof due to the thickness of the gate line 121. As a result, a defect generated in the first gate insulating layer 140 due to the step thereof defined by the thickness of the gate line 121 may be reduced or effectively prevented by the data line 171 and the drain electrode 175 being disposed on the gate line 121.

The ohmic contact layers 163 and 165 lower electrical contact resistance between the semiconductor layer 154 and the data line 171 and between the semiconductor layer 154 and the drain electrode 175.

The above-described exemplary embodiment includes the structure in which the plurality of data lines 171 and the plurality of drain electrodes 175 are disposed on (e.g., above) the semiconductor layer 154 to have substantially the same planar profiles as each other, but the invention is not limited thereto. In an alternative exemplary embodiment, a portion of the source electrode 173 and the drain electrode 175 is disposed on the semiconductor layer 154, and the source electrode 173 and the drain electrode 175 overlapping the semiconductor layer 154 are extended to be disposed on (e.g., overlapping) the second gate insulating layer 145. Where the source electrode 173 and the drain electrode 175 overlapping the semiconductor layer 154 are extended to overlap the second gate insulating layer 145, the ohmic contact layers 163 and 165 may be disposed only between the semiconductor layer 154 and the portions of the source electrode 173 and the drain electrode 175 overlapping the semiconductor layer 154.

One gate electrode 124, one source electrode 173 and one drain electrode 175 form a thin film transistor ("TFT") together with the semiconductor layer 154. A channel of the TFT is formed in the exposed portion of the semiconductor layer 154 disposed between the spaced apart source electrode 173 and the drain electrode 175.

On the second gate insulating layer 145, the data line 171 and the drain electrode 175, a passivation layer 180 is disposed. The passivation layer 180 may include or be formed from an inorganic insulating material such as silicon nitride (SiNx) or silicon oxide (SiOx). While the exemplary embodiment illustrates the passivation layer as a single layer structure (e.g., monolayer), the invention is not limited thereto. The passivation layer 180 may have a double-layered structure including an inorganic layer formed from an inorganic insulating material and an organic layer formed from an organic insulating material. A contact hole 185 exposing the drain electrode 175 is defined in the passivation layer 180.

The pixel electrode 191 connected with the drain electrode 175 via the contact hole 185, is disposed on the passivation layer 180. The pixel electrode 191 may include or be formed from a transparent metal material such as indium tin oxide ("ITO") or indium zinc oxide ("IZO").

Next, a characteristic of the gate insulating layer according to the invention will be described with reference to FIG. 3.

Figure 3:
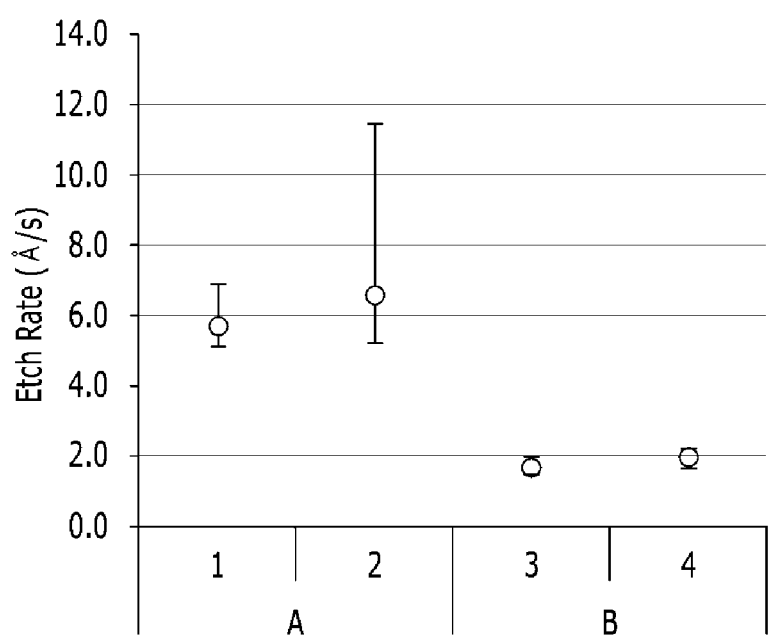
FIG. 3 is a graph illustrating an etching rate in angstroms per second (Å/s) with respect to material characteristics of an insulating layer etched using an etchant according to the invention.

FIG. 3 is a graph illustrating an etching rate in angstroms per second (Å/s) with respect to material characteristics of an insulating layer etched by an etching according to the invention.

In FIG. 3, 'A' is a gate insulating layer having tensile stress of 337 MPa, and 'B' is a gate insulating layer having compressive stress of 429 MPa.

Referring to FIG. 3, it can be seen that an etching speed of 'A' is represented as about 5 Å/s to about 7 Å/s and about 5 Å/s to about 11.5 Å/s, and an etching speed of 'B' is represented as about 1.5 Å/s to about 2.1 Å/s. That is, since the etching speed of 'B' is smaller than that of 'A', it can be seen that the gate insulating layer having the compressive stress of 429 MPa has a larger chemical resistance to the etchant than the gate insulating layer having the tensile stress of 337 MPa.

Hereinafter, a method for manufacturing the thin film transistor array display panel according to the invention will be described with reference to FIGS. 4 to 7 and FIG. 2.

FIGS. 4 to 7 are diagrams schematically illustrating an exemplary embodiment of a method of manufacturing a thin film transistor array display panel according to the invention.

Figure 4:
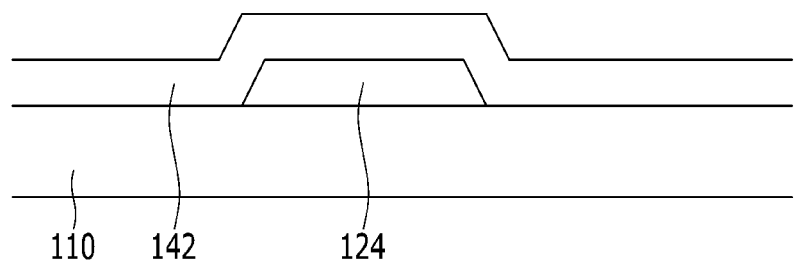
FIGS. 4 to 7 are cross-sectional diagrams schematically illustrating an exemplary embodiment of a method of manufacturing a thin film transistor array panel according to the invention.

Referring to FIG. 4, after the gate electrode 124 is formed on the substrate 110 such as by using copper or a copper alloy, an insulating material layer 142 having tensile stress of about 270 MPa to about 404 MPa is formed on the substrate 110 and the gate electrode 124.

The insulating material layer 142 is formed by using an inorganic insulating material such as silicon nitride (SiNx) and silicon oxide (SiOx). A cross-sectional thickness of the insulating material layer 142 may be the same as that of the gate electrode 124. The thicknesses may be taken as perpendicular distances between upper and lower surfaces of the respective layer. Here, when the gate electrode 124 is formed, the gate line 121 is simultaneously formed.

Figure 5:
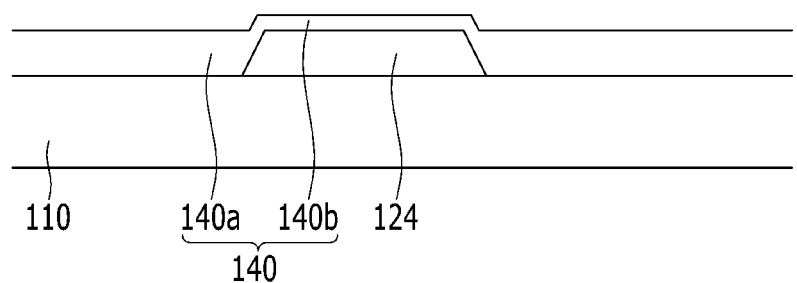

Referring to FIG. 5, the first gate insulating layer 140 is formed by removing a portion of the insulating material layer 142 formed on the gate electrode 124. A portion of the insulating material layer 142 formed on the gate line 121 is simultaneously removed when the portion of the insulating material layer 142 formed on the gate electrode 124 is removed.

The portions of the insulating material layer 142 are removed by performing a chemical mechanical polishing ("CMP") process. Accordingly, the first gate insulating layer 140 includes a first portion 140a having a first cross-sectional thickness and a second portion 140b having a second cross-sectional thickness smaller than that of the first portion 140a. The thickness of the first portion 140a may be the same as the thickness of the gate electrode 124, where thicknesses are taken from a common reference such as an upper surface of the substrate 110. The second portion 140b is formed on the gate electrode 124 to overlap a maximum thickness of the gate electrode 124 and/or the gate line 121. Here, since the portion of the insulating material layer 142 formed on the gate line 121 is simultaneously removed when the portion of the insulating material layer 142 formed on the gate electrode 124 is removed, the second portion 140b of the first gate insulating layer 140 is also formed to overlap on the gate line 121.

Figure 6:
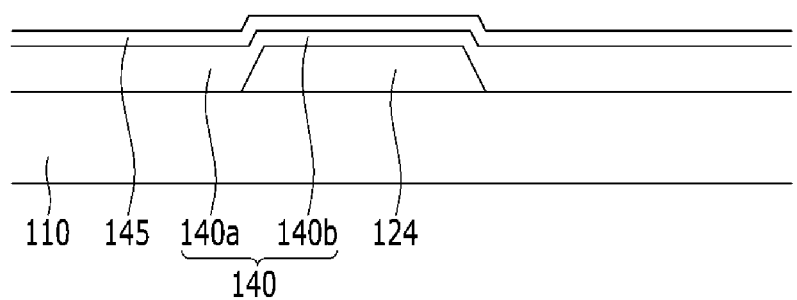

Referring to FIG. 6, a second gate insulating material layer having compressive stress of about 343 MPa to about 515 MPa is formed on the first gate insulating layer 140 to form the second gate insulating layer 145. Since the first gate insulating layer 140 has the tensile stress of about 270 MPa to about 404 MPa, the second gate insulating layer 145 having the above-described compressive stress and the first gate insulating layer 140 have stresses directed opposite to each other. The second gate insulating layer 145 is formed by using an inorganic insulating material such as silicon nitride (SiNx) and silicon oxide (SiOx). Here, the second gate insulating layer 145 may be formed from a same material as the first gate insulating layer 140.

Figure 7:
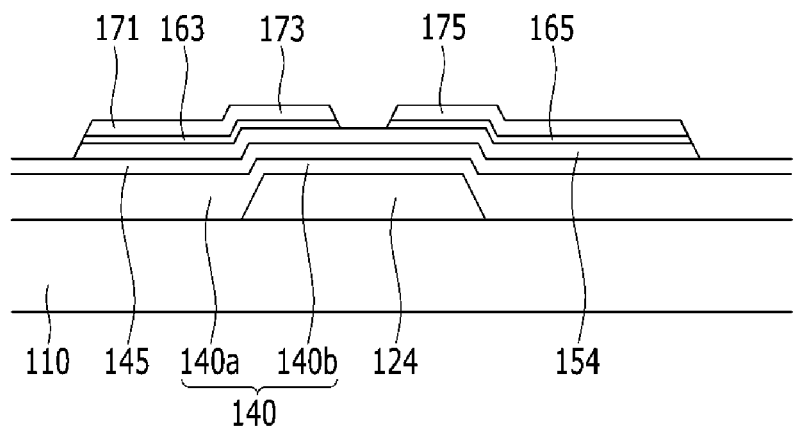

Referring to FIG. 7, a semiconductor layer 154, ohmic contact layers 163 and 165, a data line 171 including a source electrode 173, and a drain electrode 175 are formed on the second gate insulating layer 145.

Here, the semiconductor layer 154, the ohmic contact layers 163 and 165, the data line 171 including the source electrode 173, and the drain electrode 175 may be formed by using one mask, but the invention is not limited thereto. In an exemplary embodiment of a method of manufacturing a thin film transistor array display panel according to the invention, after the semiconductor layer 154 is first formed by using a separate first mask, the ohmic contact layers 163 and 165, the data line 171 including the source electrode 173, and the drain electrode 175 may be formed by using a different separate second mask.

In forming the data line 171 and the drain electrode 175, an etchant is used to pattern or shape material layers which form the data line 171 and the drain electrode 175. Since the second gate insulating layer 145 underlying the data line 171 and the drain electrode 175 has chemical resistance to the etchant used for forming the data line 171 and the drain electrode 175, erosion of the surface of the second gate insulating layer 145 by the etchant may be reduced or effectively prevented.

Referring back to FIG. 2, after the passivation layer 180 including a contact hole 185 exposing the drain electrode 175 is formed on the second gate insulating layer 145, the data line 171 and the drain electrode 175, the pixel electrode 191 connected with the drain electrode 175 through the contact hole 185 is formed on the passivation layer 180.

What is claimed is:

1. A method for a thin film transistor array panel, comprising:
    forming a gate line including a gate electrode, on a substrate;
    forming an insulating material layer on the substrate and on the gate line;
    forming a first gate insulating layer from the insulating material layer, comprising:
        forming a first portion on the substrate and adjacent to the gate line,
        forming a second portion by removing a thickness portion of the insulating material layer overlapping the gate line, and
        forming a step portion connecting the first portion and the second portion,
        wherein a thickness of the second portion is smaller than a thickness of the first portion,
    forming a second gate insulating layer on the first gate insulating layer;
    forming a semiconductor layer on the second gate insulating layer;
    forming a source electrode and a drain electrode spaced apart from each other on the semiconductor layer;
    forming a passivation layer on the second gate insulating layer, the source electrode and the drain electrode; and
    forming a pixel electrode connected with the drain electrode, on the passivation layer,
    wherein
    the first and second gate insulating layers are between the gate line and the semiconductor layer,
    the first gate insulating layer has a tensile stress, and
    the second gate insulating layer has a compressive stress.

2. The method of claim 1, wherein the gate line comprises copper or a copper alloy.

3. The method of claim 2, wherein
    the tensile stress of the first gate insulating layer is about 270 megapascals to about 404 megapascals, and
    the compressive stress of the second gate insulating layer is about 343 megapascals to about 515 megapascals.

4. The method of claim 3, wherein
    the first portion of the first gate insulating layer does not overlap the gate electrode, and
    the second portion of the first gate insulating layer is formed overlapping the gate electrode.

5. The method of claim 4, wherein the thickness of the first portion is the same as that of the gate line.

* * * * *